US007058864B1

United States Patent
McHardy et al.

(10) Patent No.: US 7,058,864 B1
(45) Date of Patent: Jun. 6, 2006

(54) TEST FOR PROCESSOR MEMORY CACHE

(75) Inventors: William Bryson McHardy, Fort Collins, CO (US); Raymond Paul Gratias, Fort Collins, CO (US); Kevin Miller, Loveland, CO (US); Brian Nugent, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 534 days.

(21) Appl. No.: 10/442,453

(22) Filed: May 21, 2003

(51) Int. Cl.
*G11C 29/00* (2006.01)

(52) U.S. Cl. .................... 714/723; 714/733

(58) Field of Classification Search ............ 711/128; 365/201; 714/718, 719, 42, 723, 733; 717/124
See application file for complete search history.

(56) References Cited

U.S. PATENT DOCUMENTS

| 6,351,789 | B1 * | 2/2002 | Green .................... 711/128 |
| 6,426,904 | B1 * | 7/2002 | Barth et al. ............. 365/201 |
| 6,519,725 | B1 * | 2/2003 | Huisman et al. ......... 714/718 |
| 6,643,807 | B1 * | 11/2003 | Heaslip et al. .......... 714/719 |
| 6,892,328 | B1 * | 5/2005 | Klein et al. ............. 714/42 |
| 6,928,638 | B1 * | 8/2005 | Parvathala et al. ...... 717/124 |

* cited by examiner

*Primary Examiner*—David Ton
(74) *Attorney, Agent, or Firm*—Hewlett Packard Company

(57) ABSTRACT

Systems, methods, software products test a memory cache of a processor that includes a test engine (e.g., a BISTE). High level test source code is formulated to use routines in API source code that, when compiled into machine test code, interfaces with the test engine. The machine test code is executed with the processor to test the memory cache to detect one or more faulty memory blocks in the memory cache. If any of the faulty memory blocks are detected, the test engine is instructed, through the machine test code, to set one or more bits in registers to functionally replace the faulty memory blocks with redundant blocks of the memory cache.

23 Claims, 3 Drawing Sheets

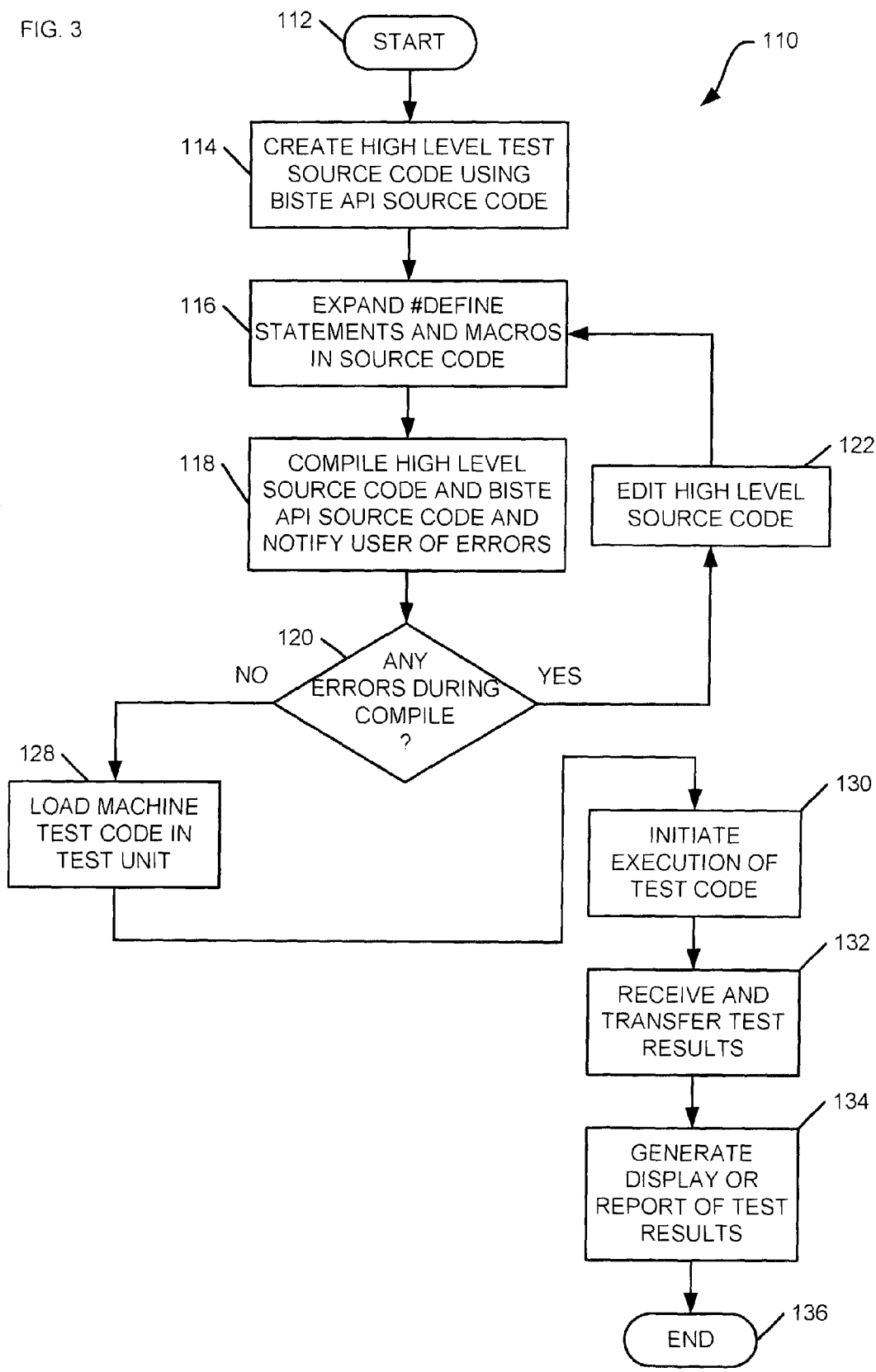

TEST FOR PROCESSOR MEMORY CACHE

BACKGROUND

Complex processors are often tested after manufacture and prior to customer shipment. Typically this testing includes (a) evaluating the processor's internal memory cache, and (b) repairing the memory cache if faults are found. To facilitate testing, the processor's designer uses a workstation to create a macro script. The macro script is a set of instructions written in low level assembly language with predefined macros that aid in constructing complex test sequences. The macro script is expanded into an assembly language source sequence that is then assembled into machine code.

The machine code is loaded into non-volatile memory of a testing device. Typically this testing device varies power supply voltages to the processor during testing to verify correct processor functionality over its full operational voltage range. Each memory block of the memory cache is individually tested. The memory cache includes redundant memory blocks to be used in place of any faulty memory blocks—so long as the faulty memory blocks are detected during testing of the processor. The processor has a one-time programmable ("OTP") memory (also known as a fuse) that encodes the faulty memory blocks such that the redundant memory blocks are later used in place of the faulty memory blocks, thereby repairing the memory cache. The processor also contains a built-in-self-test engine ("BISTE") that reads the OTP memory to map the redundant memory blocks to the faulty memory blocks in repairing the memory cache. The BISTE is controlled by the machine code when executed by the processor.

While the use of macros aid the designer in creating complex test sequences, the macro script and expanded assembly language source are difficult to comprehend and maintain due to their low-level interaction with the processor and the BISTE. The time and cost associated with developing and modifying macro scripts to accommodate new or different tests is therefore significant.

SUMMARY OF THE INVENTION

In various embodiments, one method tests memory cache of a processor that includes a test engine, including: formulating high level test source code to use routines in API source code that, when compiled into machine test code, interfaces with the test engine; executing the machine test code with the processor to test the memory cache to detect one or more faulty memory blocks in the memory cache; and, if any of the faulty memory blocks are detected, instructing the test engine, through the machine test code, to set one or more bits in registers to functionally replace the faulty memory blocks with redundant blocks of the memory cache.

One software product includes instructions, stored on computer-readable media, wherein the instructions, when executed by a computer, perform steps for testing a memory cache of a processor, including: formulating machine test code; executing the machine test code on the processor to test the memory cache to detect one or more faulty memory blocks in the memory cache; and, if any faulty memory blocks are detected, utilizing routines to set one or more bits in registers to map the faulty memory blocks to redundant memory cache blocks.

In various embodiments, one system tests a memory cache of a processor of the type that includes a test engine and programmable memory, including: machine test code means, compiled from high level test source code, and API source code, for defining tests to be performed by the test engine; and API code means for interfacing with the test engine in performing the tests to identify faulty memory blocks of the memory cache.

In various embodiments, a processor includes a memory cache for caching data within the processor. A test engine is responsive to machine test code, compiled from high level test source code using routines in API source code, to (a) test the memory cache to detect faulty memory blocks of the memory cache and (b) to set one or more bits that functionally replace the faulty memory blocks with redundant blocks of the memory cache.

BRIEF DESCRIPTION OF THE FIGURES

FIG. 3 is a flow chart illustrating one process for utilizing a built-in-self-test engine API to test a processor's memory cache.

DETAILED DESCRIPTION OF THE FIGURES

Figure 1:
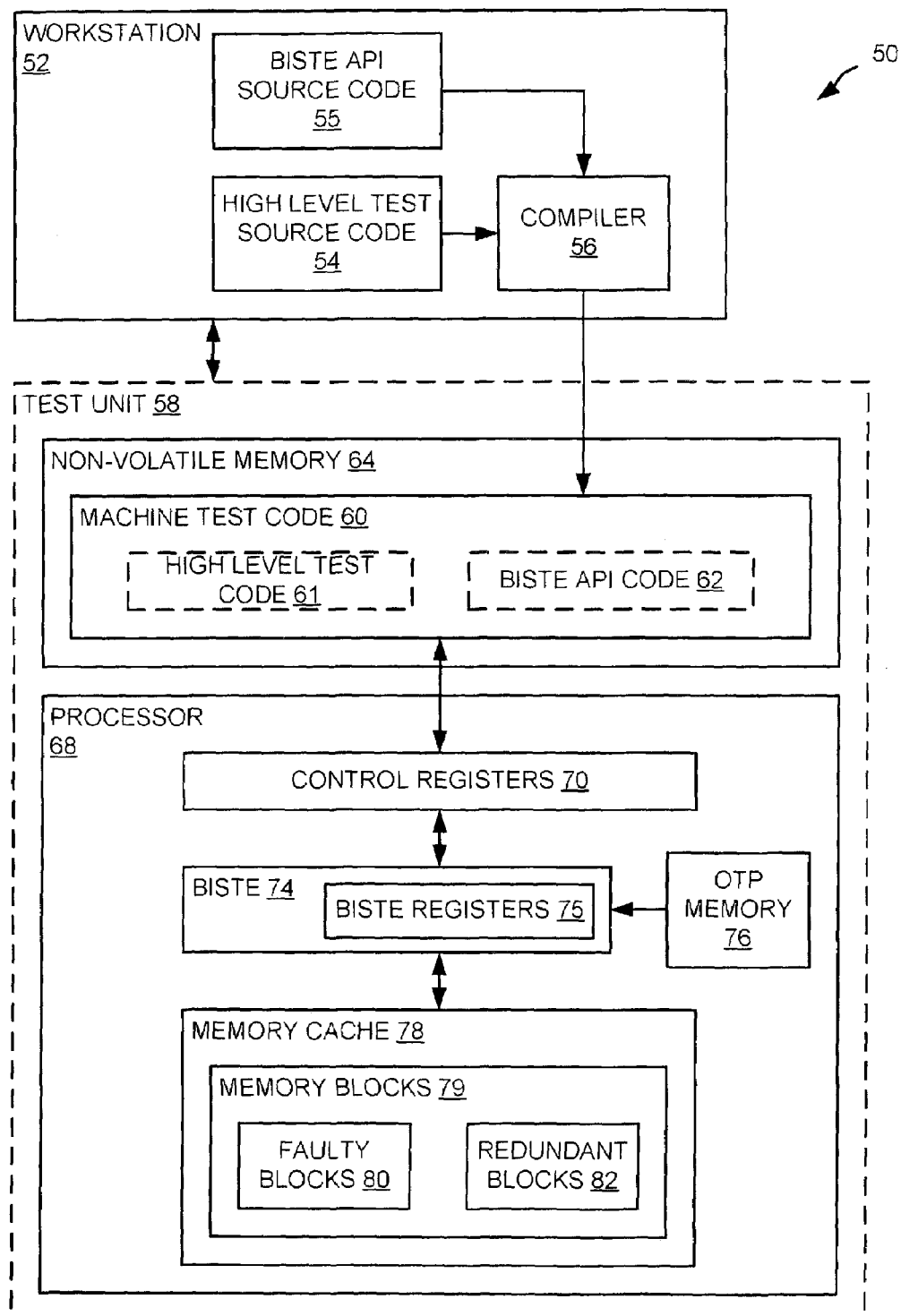
FIG. 1 shows one system utilizing a built-in-self-test engine API to test a memory cache of a processor.

FIG. 1 shows one system 50 with a processor 68 operably connected with a test unit 58. Processor 68 is constructed with a built-in-test engine ("BISTE") 74, control registers 70 and a one-time programmable ("OTP") memory 76. Test unit 58 is for example used to test processor 68 after manufacture and prior to customer shipment. A workstation 52 couples to test unit 58 and utilizes built-in-self-test engine application programming interface ("BISTE API") source code 55 and high level test source code 54 to create machine test code 60 within test unit 58. As described in more detail below, machine test code 60 then operates to test a memory cache 78 of processor 68.

Workstation 52 is for example used to create high level test source code 54 that defines tests to be performed on processor 68. BISTE API source code 55 may be developed on workstation 52 to facilitate creation, development and maintenance of high level source code 54. BISTE API source code 55 provides pre-developed routines that, when compiled into BISTE API code 62, interface with BISTE 74. High level test source code 54 and BISTE API source code 55 are, for example, compiled by a compiler 56 within workstation 52 and then transferred to test unit 58 as machine test code 60. Machine test code 60 thereby contains high level test code 61, generated from high level test source code 54, and BISTE API code 62, generated from BISTE API source code 55. Machine test code 60 is for example stored within non-volatile memory 64 of test unit 58.

High level test code 61 calls routines within BISTE API code 62 to access and control BISTE 74 through control registers 70. In one example, high level test code 61 contains calls to routines of BISTE API code 62 to perform specific tests on memory cache 78 and to return test results to test unit 58. Workstation 52 may interact with test unit 58 to display these test results. BISTE API code 62 may further contain higher level routines to repeat one or more of the tests before returning test results. BISTE API code 62 may therefore contain a hierarchy of routines to access and control BISTE 74.

Memory cache 78 is divided into memory blocks 79 that facilitate testing and repair. Certain memory blocks 79 may contain faults and are illustratively shown as faulty memory blocks 80. Memory cache 78 therefore has redundant memory blocks 82 used to repair memory cache 78 through operation of BISTE 74. BISTE 74 tests memory cache 78 and determines bits to be set in OTP memory 76 to identify faulty memory blocks 80.

BISTE 74 is used in post-manufacture testing, e.g., within test unit 58, and during normal operation, when processor 68 operates within a customer's computer system. During normal operation, this computing system effectively replaces test unit 58 by storing machine test code 60 within separate non-volatile memory. In either case, therefore, BISTE 74 performs tests on memory cache 78 during power-up to detect and functionally replace faulty memory blocks 80 and ensure operability of processor 68. Specifically, BISTE 74 reads the OTP memory bits to map redundant memory blocks 82 to faulty memory blocks 80, making memory cache 78 fully operational.

Figure 2:
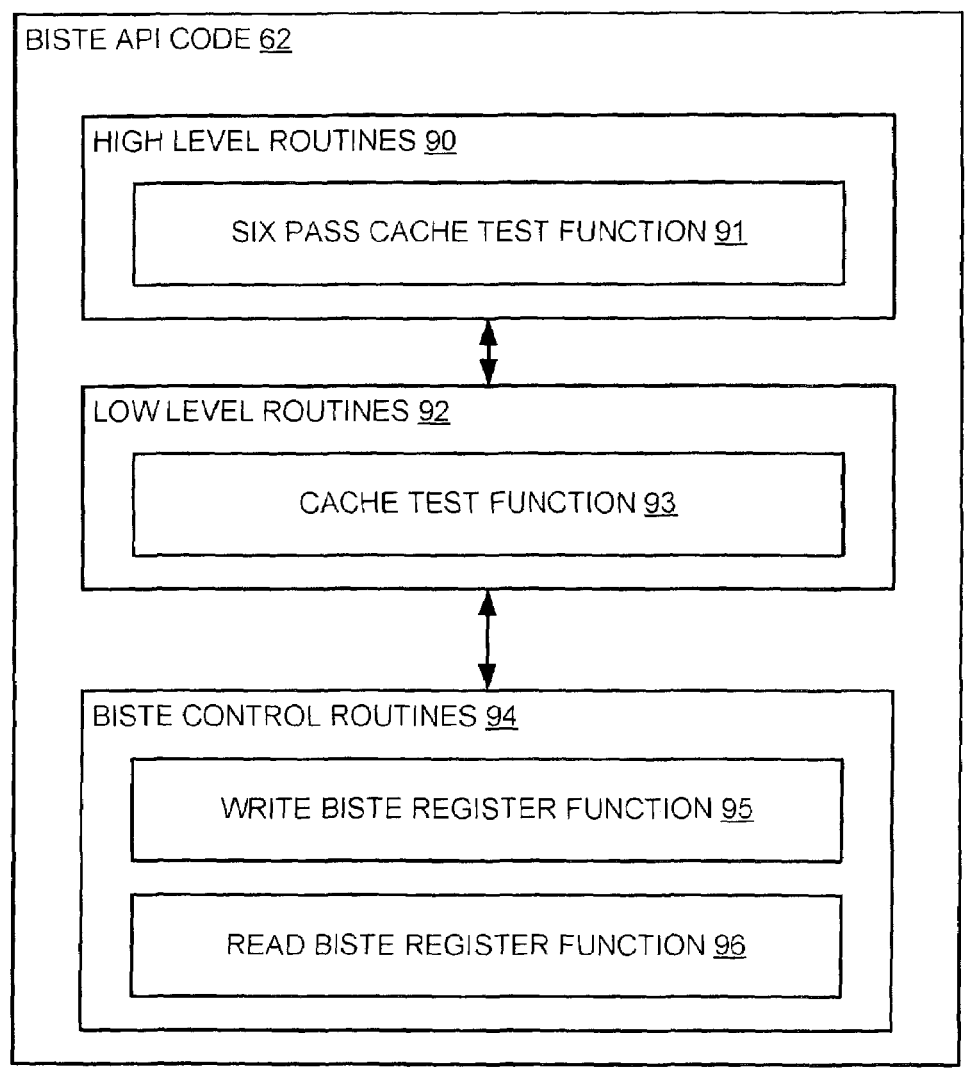
FIG. 2 shows further detail of the built-in-self-test engine API of FIG. 1.

FIG. 2 illustrates one example of functional hierarchy within BISTE API code 62. BISTE API code 62 contains high level routines 90, low level routines 92 and low level BISTE control 94. High level test code 61 calls high level routines 90 and specifies the test(s) to be performed on memory cache 78 and the number of times to repeat the test(s). These repeated tests may thus define the total area of memory cache 78 under test. High level routines 90 include functions that perform sequences within the test(s), utilizing functions of low level routines 92; in a similar manner, low level routines 92 utilize functions of BISTE control routines 94 to control BISTE 74 in performing tests and returning results.

Six pass cache test function 91 is one example of one function of high level routines 90 called by high level test code 61. Six pass cache test function 91 calls cache test function 93 of low level routines 92, which in turn calls write BISTE control register function 95 of BISTE control routines 94. High level test code 61 may call other functions of low level routines 92 and BISTE control routines 94 as a matter of design choice. In one embodiment, there are two register access levels to BISTE 74; specifically, control registers 70 to BISTE registers 75 of BISTE 74. Accordingly, BISTE control routines 94 may therefore include read BISTE register function 96, to read BISTE registers 75, and write BISTE register function 95, to write BISTE registers 75, to facilitate access to BISTE registers 75 and control registers 70.

The following pseudo code illustrates one example of high level test source code 54 utilizing BISTE API source code 55 that, when compiled into machine test code 60 by compiler 56 and executed by processor 68, controls BISTE 74 to test memory cache 78. Specifically, the pseudo code tests memory blocks 79 of memory cache 78, generates reports of test results, and effects repairs to memory cache 78 by calling a function "IdentifyBadMemoryBlock". IdentifyBadMemoryBlock generates an output identifying the faulty memory to program mapping information into OTP memory 76; this information is later used by BISTE 74 to set register bits and map redundant memory blocks 82 to faulty memory blocks 80 on power-up of processor 68.

```
* * * * * * Pseudo Code * * * * * *
uses BISTE_API;
FUNCTION TestMemoryCache;
VARIABLES
    Result : boolean;              { Stores the pass/fail result from the test }
    CacheMemoryBlock: BlockIndex;  { Used to step through memory blocks }
BEGIN
    FOR CacheMemoryBlock:=FirstCacheBlock TO LastCacheBlock DO
    BEGIN
        Result := SixPassCacheTest (CacheMemoryBlock);
        IF Result = FALSE THEN
        BEGIN
            { Errors indicate that the block must be repaired }
            IdentifyBadMemoryBlock(CacheMemoryBlock); { Keep track of bad blocks }
        END
    END;
END;
* * * * * * Pseudo Code * * * * * *
```

In the above pseudo code, FirstCacheBlock is an identifier defining a first block of memory blocks 79, and LastCacheBlock is an identifier defining a last block of memory blocks 79. A function TestMemoryCache contains a for-loop indexing from FirstCacheBlock to LastCacheBlock, to step through each block of memory blocks 79.

Each block of memory blocks 79 is then tested by six pass cache test function 91 of high level routines 90, FIG. 2. Six pass cache test function 91 returns a Boolean value indicating whether the test passed (true) or the test failed (false). If the test fails, an IdentifyBadMemoryBlock function generates an output referencing the failed memory block, identified by CacheMemoryBlock.

The following code segments illustrate one example of a '#define' statement specifying bit fields within BISTE registers 75. The segments specifically illustrate the use of a macro statement that generates source code for a processor instruction that writes bit values passed as parameters to BISTE registers 75. A source code statement is shown utilizing the macro and the '#define' statement to produce a processor assembly code instruction to load a bit pattern specified in the '#define' statement into BISTE registers 75.

define:
define L1_INDEX_CNTL_PERIOD 0,5,3,X,X,X,X,X,X, X,X,X,X,X,X,X,X,X,X,X,X,X,X,X,X Macro:
BistPutField MACRO r,x,pos,len,x,x,x,x,x,x,x,x,x,x,x,x,x, x,x,x,x,x,x,x,t depd r,pos,len,t
 .ENDM Source Code:
BistPutField %r3,L1_INDEX_CNTL_PERIOD,arg4

Through the '#define' statement, a first string of characters identifies a second string of characters. During macro expansion, at each location where the first string is used in the source code, the first string is replaced by the second string. For example, such '#define' statements may be used to specify bit field properties (e.g., location, size, default values) for use in other macros. The bit field properties are stored as comma-separated items in the second string; the position and number of the items are kept constant. If for example the third item in the second string is defined as a bit length for a register field, the third item in the second string of other associated '#define statements will also specify a register field bit length. If an item is not required for a particular definition, an 'x' fills the space in the second string to maintain the number and order of the items in the second string.

By way of example, in the above '#define', a first string identifier "L1_INDEX_CNTL_PERIOD" identifies twenty-five items separated by commas in the second string; though only twenty items are actually used of the twenty-five items. Additional parameters are included at the end of the second string and filled with 'x' characters to reserve space for future use, removing the necessity of later modifying other macros utilizing the '#define' statements when additional parameters are required in the second string. Such '#define' statements can be used in a plurality of macros without parameter-order confusion and without creating multiple copies of bit field information that is difficult to maintain.

The 'macro' definition utilizes multiple parameters as provided by the '#define' statement. In the above example, the macro is identified by the name 'BistPutField' at the start of the macro definition. This is followed by a directive, '.MACRO', which is then followed by a list of twenty-seven parameters. The center twenty-five parameters are based on the same number and order of items specified by the '#define' statement. The macro has one additional parameter, 'r', at the front, and a second additional parameter, 't', at the end. The lines shown between the '.MACRO' directive and the '.ENDM' directive, in the above example, specify text to be substituted with macro expansion of the identifier 'BistPutField'. In this example, 'depd' is a processor instruction that takes four parameters—'r', 'pos', 'len', and 't'—that are substituted by parameters passed during invocation.

In the example, the 'BistPutField' macro is invoked with just three items. The first items, '%r3', is a register identifier. The second item, 'L1_INDEX_CNTL_PERIOD', identifies the '#define' statement; and the third item, 'arg4', identifies a parameter used by the processor instruction 'depd'. The second item is replaced by the second string of the '#define' statement such that the macro item list consists of the twenty-seven items. In one example of operation, the macro uses relevant items from the list to produce the following assembly code:

depd %r3,5,3,arg4

The '#define' statement facilitates grouping of many common items into a single list. This single list assists in construction and maintenance of common items since the '#define' statement may be used in a plurality of macro definitions and source code statements.

FIG. 3 is a flow chart illustrating one process 110 for testing a memory cache 78 of a processor 68. Process 110 creates a high level test source code 54 utilizing pre-developed routines of BISTE API source code 55 that, when compiled into machine test code 60, access and control BISTE 74, which in turn tests memory cache 78.

Process 110 starts at step 112 and continues with step 114. Step 114 creates high level test source code 54 to use pre-developed routines of BISTE API source code 55.

Step 116 expands any '#define' statements and macros utilized in high level test source code 54 and BISTE API source code 55, in preparation for a compilation process in step 118.

In step 118, compiler 56 generates machine test code 60 from the expanded source code of step 116. Machine test code 60 contains BISTE API code 62, generated from BISTE API source code 55, and high level test code 61, generated from high level test source code 54. In step 118, compiler 56 also notifies the user of any errors detected during compilation of the source code.

Step 120 is a decision. If errors were detected during the compilation process of step 118, process 110 continues with step 122; otherwise process 110 continues with step 128.

Step 122 provides for editing of high level test source code 54, to correct errors identified during the compilation process of step 118. Upon reading and fully appreciating this disclosure, one skilled in the art appreciates that the creation 114 of high level test source code 54 may involve an interactive editing process using editing software on workstation 52, for example. When source code 54 compiles without errors, process 110 continues with step 128.

Step 128 loads machine test code 60, generated in step 118, into test unit 58. Process 110 continues with step 130.

Step 130 executes machine test code 60 on processor 68. In one embodiment, machine test code 60 performs tests on memory cache 78 using BISTE 74. Machine test code 60 may also instruct BISTE 74 to set its registers 75 to map the redundant memory blocks to the faulty memory blocks.

In step 132, machine test code 60 accumulates results from BISTE 74 and transfers the results to test unit 58.

Step 134 generates a display or report of the results received from machine test code 60. Process 110 terminates at step 136.

The creation of high level test source code 54 and generation of machine test code 60 for testing memory cache 78 of processor 68 is simplified and expedited by use of BISTE API source code 55. Further, the use of '#define' statements and macros in the source code (created during the development of BISTE API source code 55) increases readability and maintainability of the processor's complex sequences used to control BISTE 74.

Changes may be made in the above methods, apparatus and systems without departing from the scope hereof. For example, OTP memory 76 may be other memory, e.g., erasable-programmable read only memory ("EPROM"), electrically erasable programmable read only memory ("EEPROM"), non-volatile random access memory ("NVRAM"), etc. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for testing memory cache of a processor that includes a test engine, comprising:
formulating high level test source code to use routines in API source code that, when compiled into machine test code, interfaces with the test engine;
executing the machine test code with the processor to test the memory cache to detect one or more faulty memory blocks in the memory cache; and
if any of the faulty memory blocks are detected, instructing the test engine, through the machine test code, to set one or more bits in registers to functionally replace the faulty memory blocks with redundant blocks of the memory cache.

2. The method of claim 1, the steps of executing and instructing further comprising reading and writing to control registers of the processor.

3. The method of claim 1, the step of formulating further comprising:
editing the high level test source code to remove errors in the high level test source code detected during generation of the machine test code; and
re-generating the machine test code from the high level test source code.

4. The method of claim 1, wherein the test engine is a BISTE, the step of instructing the test engine comprising utilizing BISTE registers.

5. The method of claim 1, the step of formulating high level test source code further comprising specifying register values with one or more #define statements used within one or more macros of the high level test source code, the #define statements comprising a predefined order and number of comma-separated items.

6. The method of claim 1, wherein the test engine is a BISTE and the API source code is BISTE API source code.

7. A software product comprising instructions, stored on computer-readable media, wherein the instructions, when executed by a computer, perform steps for testing a memory cache of a processor, comprising:
formulating machine test code;
executing the machine test code on the processor to test the memory cache to detect one or more faulty memory blocks in the memory cache; and
if any faulty memory blocks are detected, utilizing routines to set one or more bits in registers to map the faulty memory blocks to redundant memory cache blocks.

8. The software product of claim 7, the step of formulating comprising utilizing a BISTE API code as an interface to a BISTE from a high level test source code.

9. The software product of claim 8, the step of utilizing comprising utilizing one or more of high level routines, low level routines and BISTE control routines within the BISTE API code.

10. The software product of claim 9, the high level routines calling the low level routines, the low level routines calling the BISTE control routines.

11. The software product of claim 7, the step of executing further comprising collecting and storing test results.

12. The software product of claim 11, further comprising generating a display or report of the test results.

13. The software product of claim 7, the step of formulating comprising specifying register values with one or more #define statements used within one or more macros of a high level test source code and a BISTE API source code, the #define statements comprising a predefined order and number of comma-separated items.

14. A system for testing a memory cache of a processor of the type that includes a test engine and programmable memory, comprising:
machine test code means, compiled from high level test source code, and API source code, for defining tests to be performed by the test engine; and
API code means for interfacing with the test engine in performing the tests to identify faulty memory blocks of the memory cache.

15. The system of claim 14, the machine test code means utilizing the API source code to instruct the test engine to functionally replace the faulty memory blocks identified by the programmable memory with redundant blocks of the memory cache.

16. The system of claim 15, further comprising a test unit with non-volatile memory for storing the machine test code means.

17. The system of claim 16, further comprising a workstation, interfacing with the test unit, for compiling the high level test source code and API source code and into the machine test code means within the test unit.

18. The system of claim 16, the machine test code means further comprising means for collecting and transferring test results to the test unit.

19. The system of claim 18, further comprising means for generating a display or report of the test results.

20. The system of claim 14, wherein the programmable memory is an OTP memory, wherein the test engine is a BISTE, and wherein the API source code is BISTE API source code.

21. A processor, comprising:
a memory cache for caching data within the processor; and
a test engine responsive to machine test code, compiled from high level test source code using routines in API source code, to (a) test the memory cache to detect faulty memory blocks of the memory cache and (b) to set one or more bits that functionally replace the faulty memory blocks with redundant blocks of the memory cache.

22. The processor of claim 21, further comprising a programmable memory for identifying the faulty memory blocks, the test engine accessing the programmable memory in setting the one or more bits.

23. The processor of claim 22, wherein the test engine is a BISTE and the programmable memory is an OTP memory, the OTP memory being accessible by the BISTE to set the one or more bits.

* * * * *